(12) United States Patent
Okumura

(10) Patent No.: US 6,265,744 B1
(45) Date of Patent: *Jul. 24, 2001

(54) SEMICONDUCTOR DEVICE HAVING A TRENCH STRUCTURE AND METHOD FOR MANUFACTURING THE SAME

(75) Inventor: Hideki Okumura, Yokohama (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/304,342

(22) Filed: May 4, 1999

(30) Foreign Application Priority Data

May 8, 1998 (JP) .................................................. 10-125895

(51) Int. Cl.[7] .......................... H01L 29/76; H01L 29/94; H01L 31/062; H01L 31/113; H01L 31/119
(52) U.S. Cl. .......................... 257/330; 257/331; 257/332; 257/301; 257/302; 257/304; 438/270; 438/271
(58) Field of Search ..................................... 257/301, 302, 257/304, 330, 331, 332; 438/243, 386, 270, 271

(56) References Cited

U.S. PATENT DOCUMENTS 5,321,289 6/1994 Baba et al. .
5,714,775 2/1998 Inoue et al. .

*Primary Examiner*—Mahshid Saadat
*Assistant Examiner*—Jesse A Fenty
(74) *Attorney, Agent, or Firm*—Finnegan, Henderson, Farabow, Garrett, & Dunner, L.L.P.

(57) ABSTRACT

An electronic field reduction in a corner of a trench section of a semiconductor is achieved by forming a p-type base region in a source area of an n-type drain region, and both an n-type source region and a gate leading region are formed in a surface area of the p-type base region separately from each other. A trench section is formed in both the source region and gate leading region to reach the drain region. Polysilicon is formed in the trench section and on the surface of a semiconductor substrate with a gate insulation film interposed therebetween and then thermally treated. An interlayer insulation film is deposited on the entire surface of the semiconductor substrate, and then contact holes reaching the gate leading region and the source and base regions in the peripheral portion of the trench section in the source region are formed. A source/base electrode which contacts both the source and base regions through one of the contact holes is formed. A gate electrode is formed which contacts both the gate leading region and the polysilicon in the trench through the other contact hole.

12 Claims, 7 Drawing Sheets

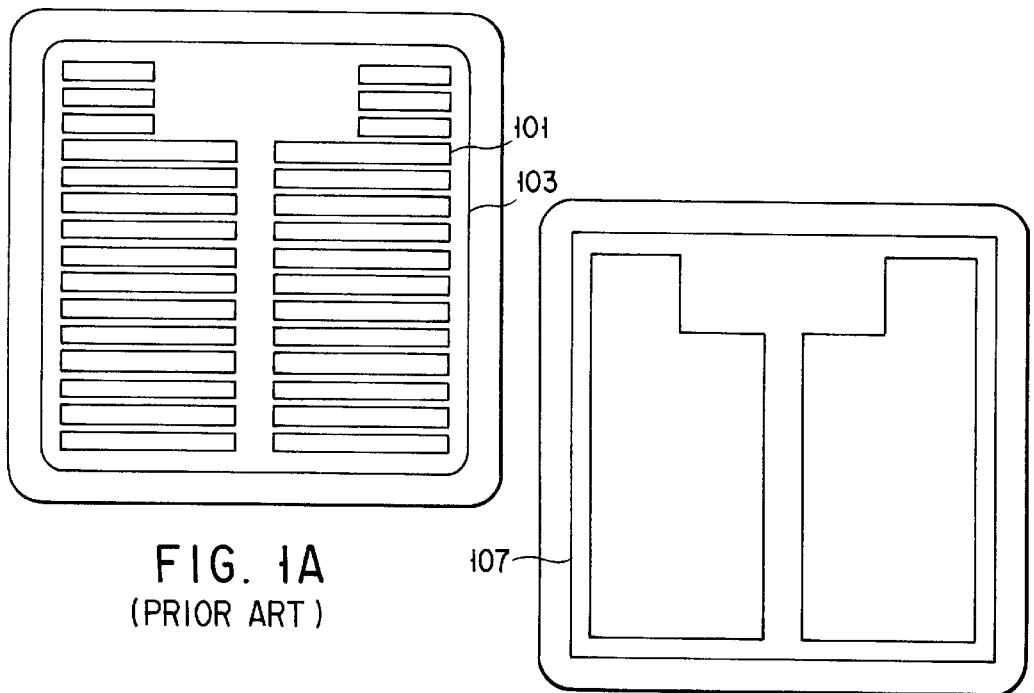
FIG. 1A (PRIOR ART)
FIG. 1C (PRIOR ART)
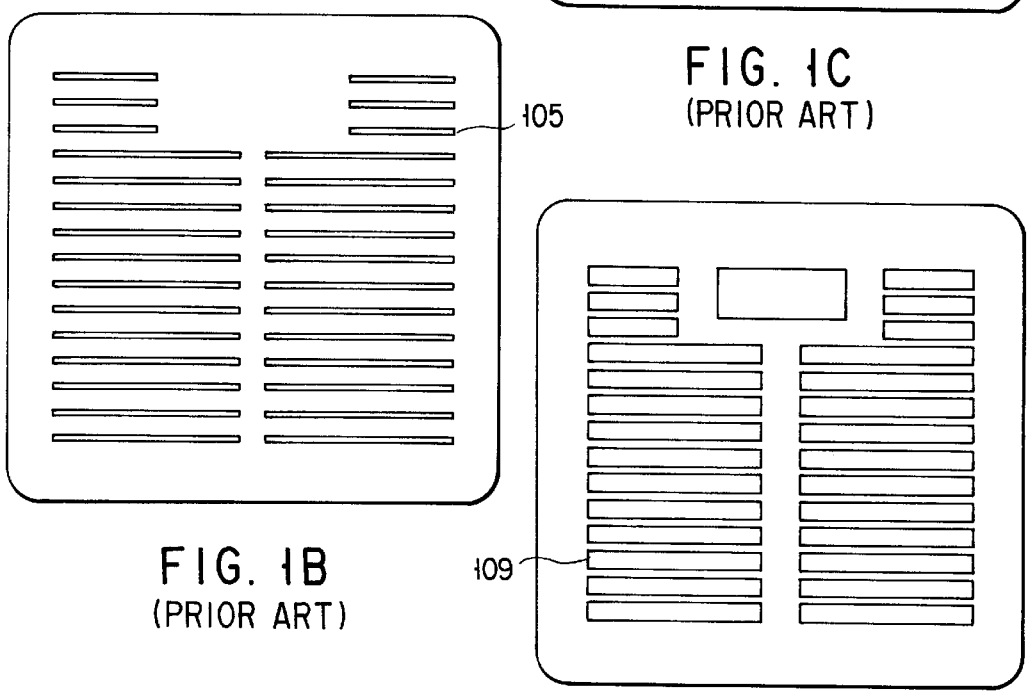
FIG. 1B (PRIOR ART)
FIG. 1D (PRIOR ART)

SEMICONDUCTOR DEVICE HAVING A TRENCH STRUCTURE AND METHOD FOR MANUFACTURING THE SAME

BACKGROUND OF THE INVENTION

The present invention relates to a semiconductor device having a trench structure and a method for manufacturing the same. More specifically, the present invention relates to a gate contact structure of a MOSFET (insulated-gate electric field transistor) in which a side wall of a trench serves as a channel region or an IGBT (insulated-gate bipolar transistor), and a method for manufacturing the structure.

Conventionally a semiconductor device including a number of trench MOSFETs in which a side wall of a trench serves as a channel region, arranged in parallel on a semiconductor substrate (referred to as a U-MOS hereinafter) and a semiconductor device including a number of trench IGBTs arranged in parallel on a semiconductor substrate (referred to as a U-IGBT hereinafter), have been known.

FIGS. 1A to 1D schematically show pattern structures of a prior art U-MOS to be manufactured.

FIG. 1A illustrates a source pattern 101 and a base pattern 103 of the U-MOS, FIG. 1B shows a trench pattern 105 thereof, FIG. 1C shows a gate electrode leading pattern 107 thereof, and FIG. 1D illustrates a contact forming pattern 109 thereof.

FIG. 2A schematically shows the status of the prior art U-MOS subsequent to a step of making a contact hole based on the contact forming pattern 109 in the manufacturing process of the prior art U-MOS. FIG. 2B is a schematic cross-sectional view taken along line 2B—2B of FIG. 2A, and FIG. 2C is a schematic cross-sectional view taken along line 2C—2C of FIG. 2A.

An outline of the manufacturing process of the above prior art U-MOS will now be described. First, based on the source pattern 101 and base pattern 103 shown in FIG. 1A, a source region 125 and a base region 123 are formed in a surface area of a semiconductor substrate (drain region) 121.

Next, based on the comb trench pattern 105 shown in FIG. 1B, a number of trenches 127 are formed in the source region 125 to a depth reaching the drain region 121. After that, a gate insulation film 129 is formed on the inner wall of each of the trenches 127 and on the surface of the semiconductor substrate. In order to form a gate electrode leading portion (which will be described later) in part of the base region 123, the trenches 127 are not formed in the part of the base region 123. In other words, the trench pattern 105 is partly missed.

Thereafter, polysilicon 131 is buried into each of the trenches 127 and deposited on the entire surface of the semiconductor substrate including the surface of the gate insulation film 129. The polysilicon 131 is then thermally treated or the impurities introduced into the polysilicon are activated by the thermal treatment.

After that, based on the gate electrode leading pattern 107 shown in FIG. 1C, the thermally-treated polysilicon 131 is patterned to form a pad 133 for contact through which a gate electrode is led to the missing portion of the trenches 127 and, at the same time, to etch back the top surface of the polysilicon 131 buried into the trenches 127.

An interlayer insulation film 135 is deposited on the entire surface of the semiconductor substrate and then a large contact hole 137 for leading the gate electrode is formed in the interlayer insulation film 135 formed on the pad 133. Simultaneously, a number of source/base leading contact holes 139 are formed in the interlayer insulation film 135 in the peripheral portions of the trenches 127 and its underlying gate insulation film 129.

After that, as illustrated in FIGS. 3A and 3B, a metal wiring layer (e.g., aluminum wiring layer) is formed on the whole surface of the semiconductor substrate by sputtering and subjected to necessary patterning to form both a source/base electrode 141 and a gate electrode 143.

Moreover, a drain electrode 145 is formed on the underside of the semiconductor substrate to complete the U-MOS.

FIG. 4 illustrates an equivalent circuit of the above-described prior art U-MOS having a trench structure. Using this U-MOS, a source S and a back gate (base region) BG are grounded, and a voltage of not higher than 100V is applied to a drain D while a voltage of not higher than 30V is applied to a gate G.

The foregoing manufacturing process of the prior art U-MOS, however, has the following problem. An extra exposure step of forming the pad 133 is required in addition to an exposure step associated with PEP (photoengraving process) for making a gate electrode leading contact hole 137 in the interlayer insulation film 135, and the number of manufacturing steps is increased accordingly.

Furthermore, the prior art U-MOS has the following problem. An electric field is concentrated upon a trench corner portion (indicated by A in FIG. 3B), which is extracted from inside the trench 127 and led to the pad 133, and the gate insulation film 129 is decreased in reliability.

The same problems as described above are caused in the prior art U-IGBT.

BRIEF SUMMARY OF THE INVENTION

An object of the present invention is to provide a semiconductor device capable of reducing the number of manufacturing steps and preventing an electric field from concentrating on a trench corner portion to improve the reliability of a gate insulation film, and a method for manufacturing the same semiconductor device.

In order to attain the above object, according to a first aspect of the present invention, there is provided a semiconductor device comprising a semiconductor substrate of a first conductivity type serving as a drain region of a MOS transistor, a base region of the MOS transistor formed in a surface area of the semiconductor substrate and constituted of a semiconductor layer of a second conductivity type, a source region of the first conductivity type and a gate leading region of the first conductivity type both formed in a surface area of the base region separately from each other, a trench section formed in the source region and the gate leading region to such a depth as to penetrate the base region, a gate insulation film formed on an inner wall of the trench section and a surface of the semiconductor substrate, polysilicon buried into the trench section and thermally treated, an interlayer insulation film deposited on the semiconductor substrate, and a gate electrode contacting both the gate leading region and the polysilicon in the trench section in the gate leading region through a gate electrode contact hole corresponding to the gate leading region and formed in the interlayer insulation film and the gate insulation film formed thereunder.

According to a second aspect of the present invention, there is provided a method of manufacturing a semiconductor device, comprising the steps of forming a base region of a second conductivity type in a surface area of a semiconductor substrate of a first conductivity type, forming both a source region of the first conductivity type and a gate leading region of the first conductivity type in a surface area of the base region separately from each other, forming a trench section in the source region and the gate leading region to such a depth as to penetrate the base region, burying polysilicon into the trench section with a gate insulation film interposed therebetween, thermally treating the polysilicon, and then etching back an entire surface of the polysilicon in the trench section until a top surface of the polysilicon becomes lower than a surface of the semiconductor substrate, depositing an interlayer insulation film on an entire surface of the semiconductor substrate with the gate insulation film interposed therebetween and then forming a gate electrode contact hole, which corresponds to the gate leading region, in the interlayer insulation film and the gate insulation film formed thereunder, and forming a gate electrode contacting both the gate leading region and the polysilicon in the trench section in the gate leading region through the gate electrode contact hole.

According to a third aspect of the present invention, there is provided a method of manufacturing a semiconductor device, comprising the steps of forming a base region of a second conductivity type in a surface area of a semiconductor substrate of a first conductivity type, forming both a source region of the first conductivity type and a gate leading region of the first conductivity type in a surface area of the base region separately from each other, forming a trench section in the source region and the gate leading region to such a depth as to penetrate the base region, forming a gate insulation film on an inner wall of the trench section and a surface of the semiconductor substrate, burying polysilicon into the trench section with the gate insulation film interposed therebetween, thermally treating the polysilicon, and then etching back an entire surface of the polysilicon in the trench section until a top surface of the polysilicon becomes lower than a surface of the semiconductor substrate, depositing an interlayer insulation film on an entire surface of the semiconductor substrate, and then forming a gate electrode contact hole, which corresponds to the gate leading region, in the interlayer insulation film and the gate insulation film formed thereunder and forming a source/base leading contact hole in a peripheral portion of the trench section in the source region, and forming a gate electrode contacting both the gate leading region and the polysilicon in the trench section in the gate leading region through the gate electrode contact hole, and forming a source/base electrode contacting both the source region and the base region in the peripheral portion of the trench section through the source/base leading contact hole.

According to a semiconductor device so constituted and a method for manufacturing the same, both a step of forming a pad for contact for leading a gate electrode, which is associated with an exposure step, and a step of extracting polysilicon from inside a trench section and leading it to the pad can be deleted. Thus, the number of manufacturing steps can be reduced and an electric field can be prevented from concentrating on a corner portion of the trench section.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A to 1D are schematic plan views showing patterns of the structure of a prior art U-MOS to be manufactured;

DETAILED DESCRIPTION OF THE INVENTION

Embodiments of the present invention will now be described with reference to the accompanying drawings.

(First Embodiment)

Figure 2A:
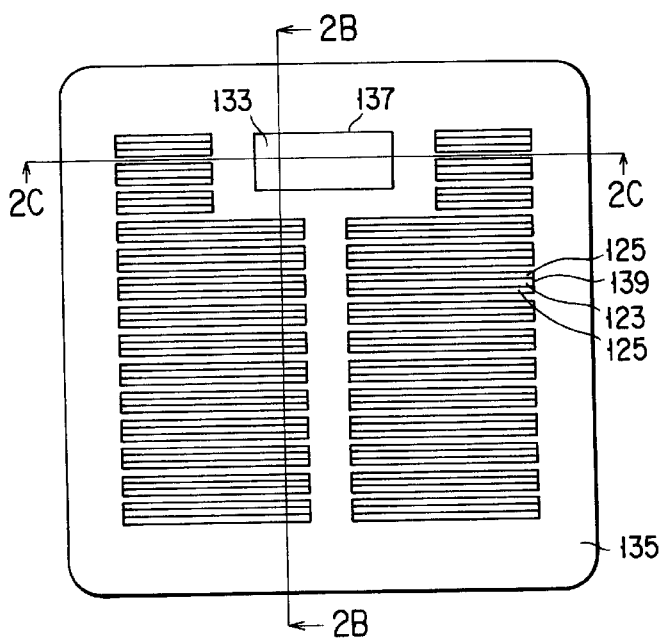
FIG. 2A is a schematic plan view for explaining an outline of a process of manufacturing the prior art U-MOS based on the patterns shown in FIGS. 1A to 1D.
Figure 2B:
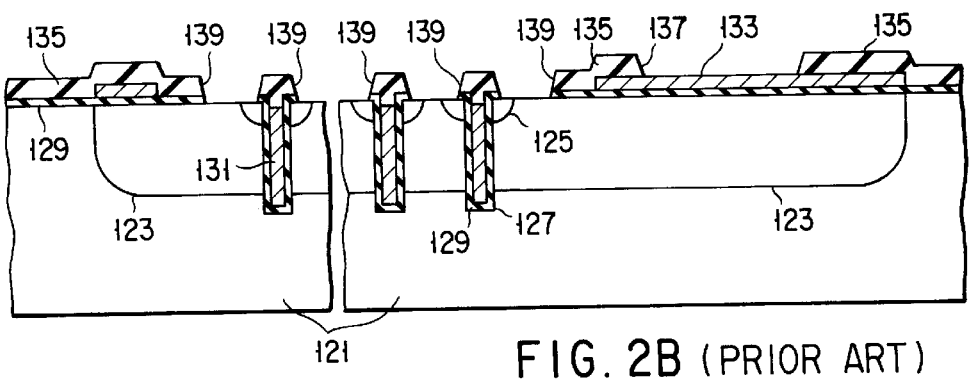
FIG. 2B is a schematic cross-sectional view of the U-MOS taken along line 2B—2B of FIG. 2A.
Figure 2C:
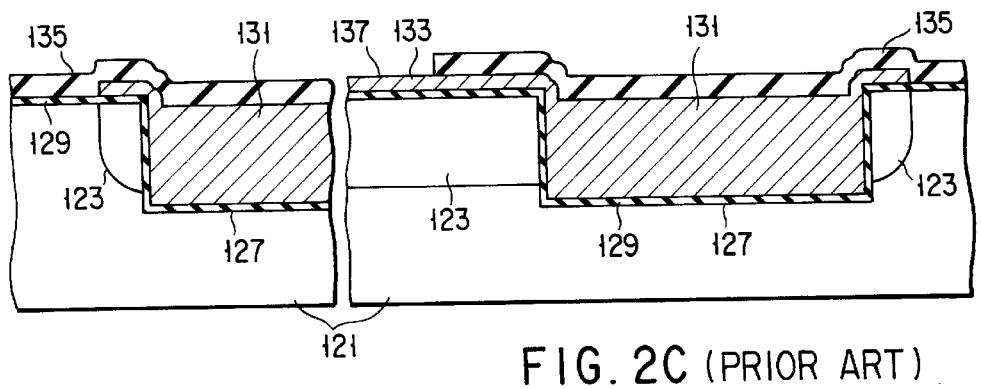
FIG. 2C is a schematic cross-sectional view of the U-MOS taken along line 2C—2C of FIG. 2A.
Figure 3A:
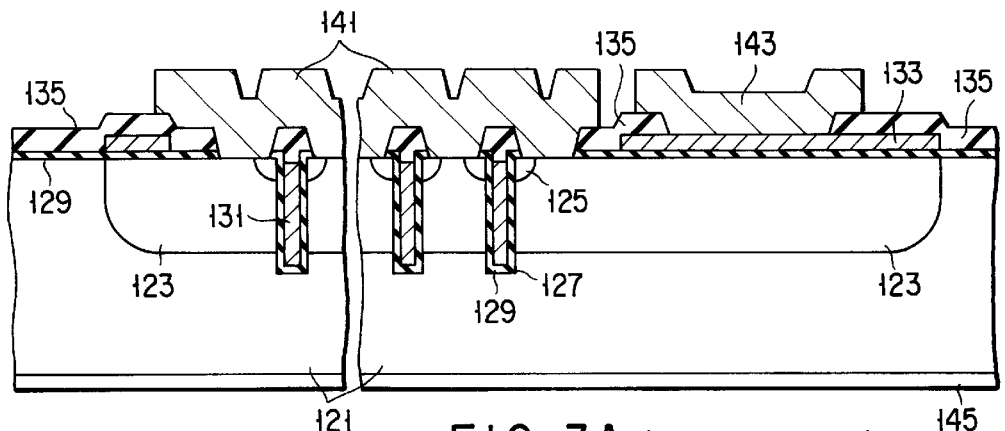
FIGS. 3A and 3B are schematic cross-sectional views illustrating the structure of the prior art U-MOS.
Figure 3B:
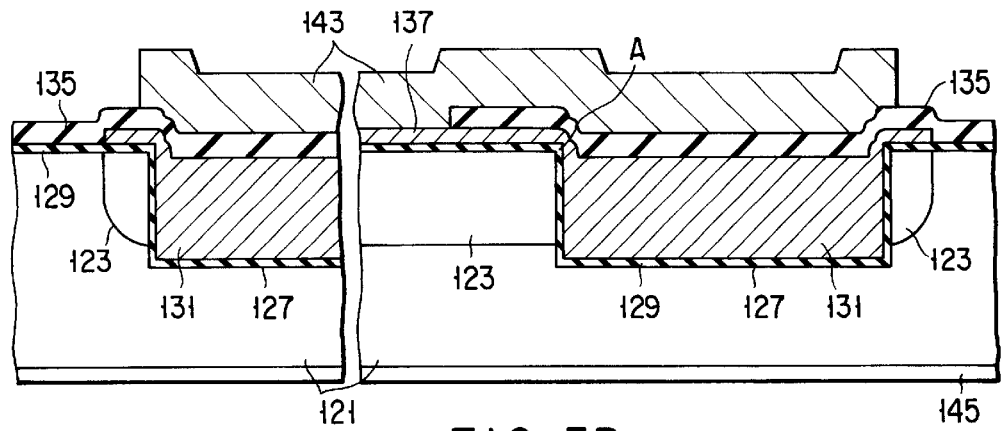
Figure 4:
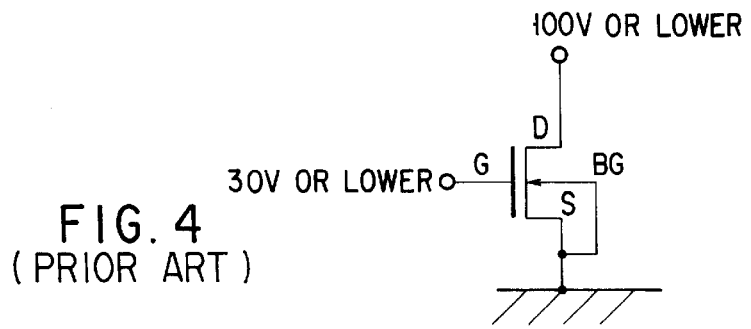
FIG. 4 is an equivalent circuit diagram of the prior art U-MOS illustrated in FIGS. 3A and 3B.
Figure 5A:
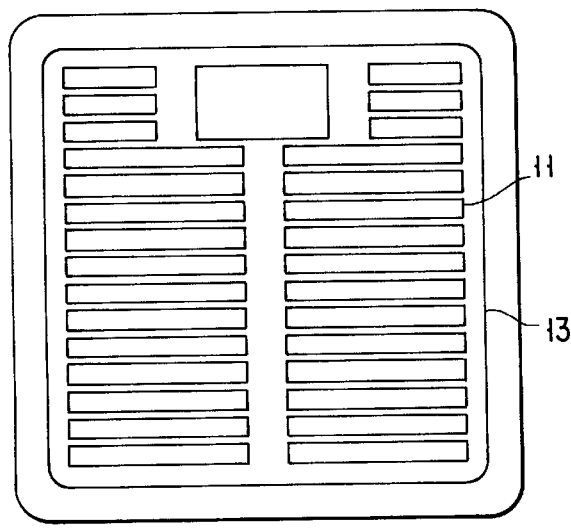
FIGS. 5A to 5C are schematic plan views showing patterns of the structure of a U-MOS according to a first embodiment of the present invention which is to be manufactured.
Figure 5B:
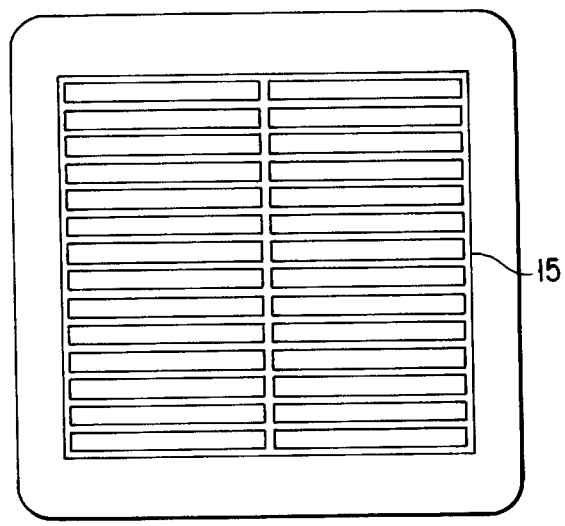
Figure 5C:
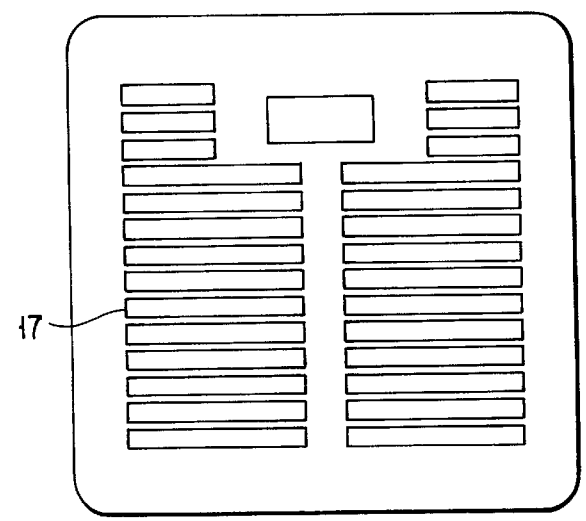

FIGS. 5A to 5C schematically show patterns of the structure of a U-MOS according to a first embodiment of the present invention which is to be manufactured. FIG. 5A illustrates a source pattern 11 and a base pattern 13 of the U-MOS, FIG. 5B shows a trench pattern 15 thereof, and FIG. 5C shows a contact forming pattern 17 thereof.

Figure 6A:
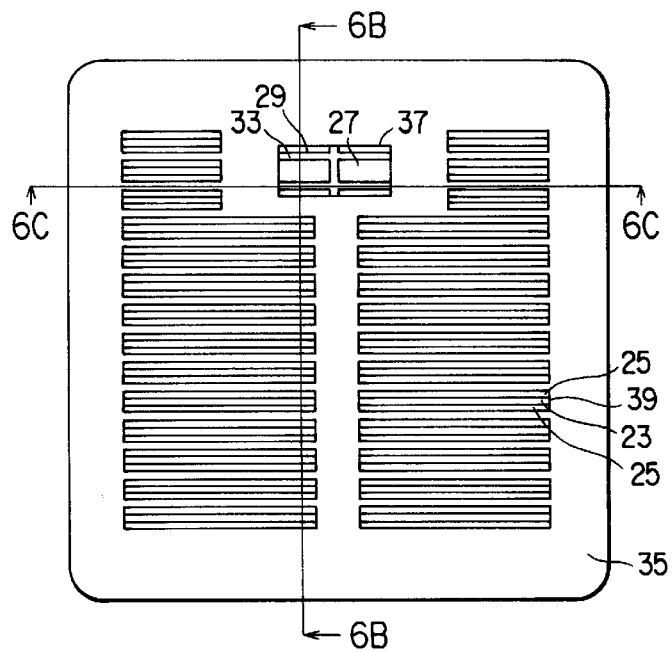
FIG. 6A is a schematic cross-sectional view for explaining an outline of a process of manufacturing the U-MOS based on the patterns shown in FIGS. 5A to 5C.
Figure 6B:
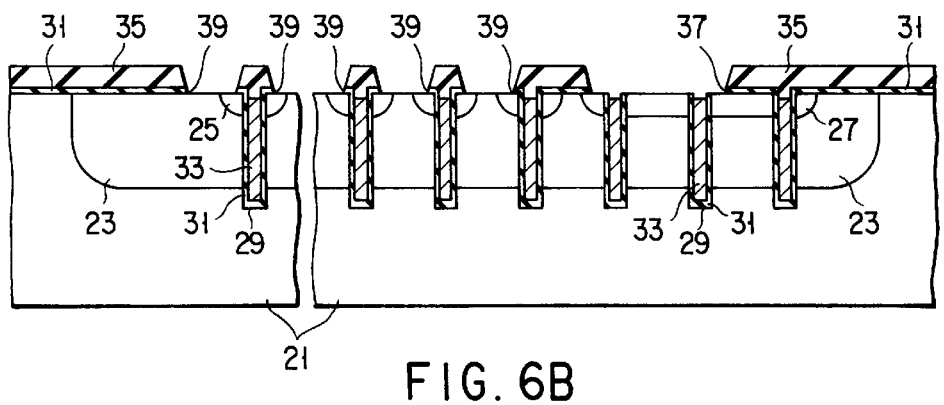
FIG. 6B is a schematic cross-sectional view of the U-MOS taken along line 6B—6B of FIG. 6A.
Figure 6C:
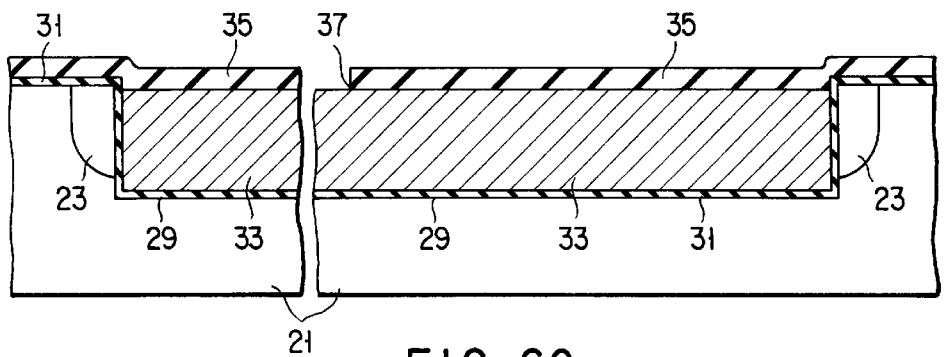
FIG. 6C is a schematic cross-sectional view of the U-MOS taken along line 6C—6C of FIG. 6A.

FIG. 6A schematically shows the status of the U-MOS subsequent to a step of making a contact hole based on the contact forming pattern 17 in the manufacturing process of the U-MOS. FIG. 6B is a schematic cross-sectional view taken along line 6B—6B of FIG. 6A, and FIG. 6C is a schematic cross-sectional view taken along line 6C—6C of FIG. 6A.

An outline of the manufacturing process of the U-MOS according to the first embodiment of the present invention will now be described.

First, based on the source and base patterns 11 and 13 shown in FIG. 5A, a p-type base region (back gate region) 23 is formed in a surface area of an n-type semiconductor substrate (e.g., silicon substrate) 21 serving as a drain region, and n-type source regions 25 and an n-type gate leading region 27 are formed in a surface area of the base region 23 separately from each other. The gate leading region 27 is formed in a region corresponding to the gate electrode contact pad of the prior art, so as to have a large pattern.

Next, based on a grid-like trench pattern 15 having a plurality of trenches coupled to (short-circuited with) each other as shown in FIG. 5B, a number of trenches 29 are formed in the source region 25 and gate leading region 27 to such a depth as to reach the drain region 21 through the base region 23. After that, a gate insulation film 31 is formed on the inner walls of the trenches 29 and the surface of the semiconductor substrate.

In the grid-like trench pattern 15 of the first embodiment, the plural trenches are coupled at their end portions in the longitudinal direction and substantially the middle portion in the longitudinal direction. However, the present invention is not limited to such a pattern. For example, the trenches can be coupled at plural middle portions in the longitudinal direction.

Next, polysilicon 33 is buried into each of the trenches 29 and thermally treated. The whole surface of the polysilicon 33 is etched back until its top surface becomes lower than the surface of the semiconductor substrate. It should be noted here that no patterning is performed for the polysilicon 33.

An interlayer insulation film 35 is deposited on the entire surface of the semiconductor substrate and, based on the contact forming pattern 17 shown in FIG. 5C, a contact hole 37 for the gate electrode contact is formed in the gate insulation film 31 and interlayer insulation film 35 corresponding to the gate leading region 27. At the same time, a number of source/base leading contact holes 39 are formed in the interlayer insulation film 35 in the peripheral portions of the trenches 29 and its underlying gate insulation film 31. In this case, some of the trenches 29 are included in the gate leading region 27.

Figure 7A:
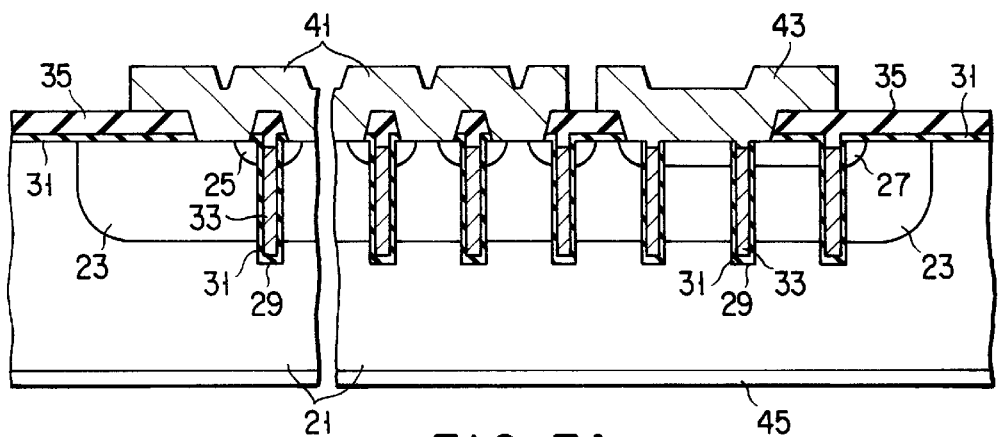
FIGS. 7A and 7B are schematic cross-sectional views illustrating the structure of the U-MOS according to the first embodiment of the present invention.
Figure 7B:
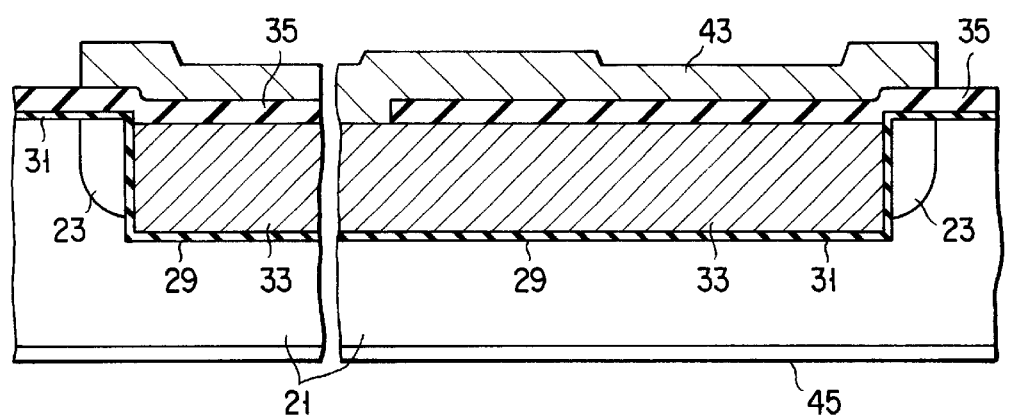

After that, as illustrated in FIGS. 7A and 7B, a metal wiring layer (e.g., aluminum wiring layer) is formed on the whole surface of the semiconductor substrate by sputtering and subjected to patterning to form a source/base electrode 41 and a gate electrode 43. The source/base electrode 41 is formed so as to contact both the base region 23 and the source regions 25 in the peripheral portions of the trenches 29 (outside the gate leading region 27). The gate electrode 43 is formed so as to contact both the gate leading region 27 and the polysilicon 33 buried into the trenches 29 in the region 27.

Moreover, a drain electrode 45 is formed on the underside of the semiconductor substrate to complete the U-MOS.

Figure 8:
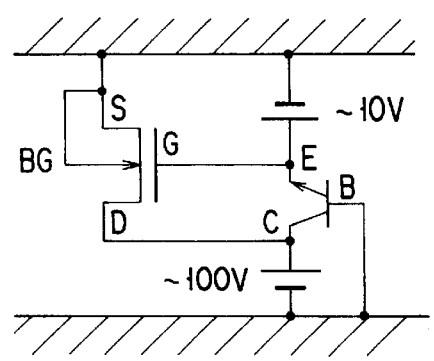
FIG. 8 is an equivalent circuit diagram of the U-MOS illustrated in FIGS. 7A and 7B.

FIG. 8 illustrates an equivalent circuit of a U-MOS having a trench constitution as described above. In using the U-MOS, a source S and a back gate BG are grounded, and a voltage of 100V is applied to a drain D while a voltage of not higher than 10V is applied to a gate G.

The U-MOS shown in FIGS. 7A and 7B includes a parasitic npn transistor in which the drain (D) region 21, base region (back gate (BG) region) 23 and gate leading region 27 correspond to collector C, base B and emitter E, respectively as well as an n-channel MOS transistor having the source (S) region 25, back gate (BG) region 23, drain (D) region 21 and gate (G) electrode 43.

When the U-MOS so constituted is employed, a reverse bias is applied to a pn junction between the p-type base region 23 and n-type gate leading region 27. Since, therefore, a withstand voltage of the pn junction (a withstand voltage between the gate electrode 41 and base region 23) is relatively low, the U-MOS is suitable for being driven at a lower voltage.

The feature of the above-described manufacturing process of the U-MOS according to the first embodiment is summarized as follows. The source region 25 and gate leading region 27 of the same conductivity type are formed simultaneously in the base region 21 so as to be separated from each other. In these regions 25 and 27, the plural trenches 29 are coupled to each other to form a trench section having a grid pattern. The gate electrode 41 is formed so as to contact both the gate leading region 27 and the polysilicon 33 in the trench section.

With the above feature, a step of forming a pad for the gate electrode leading contact, which involves an exposure step and has conventionally been required, can be deleted, thereby reducing the number of manufacturing steps.

Moreover, a step of extracting the polysilicon from the trench section and leading it to the pad, which has been also conventionally required, can be deleted to prevent an electric field from concentrating upon a corner portions of the trench section and improve the reliability of the gate insulation film.

(second Embodiment)

Figure 9:
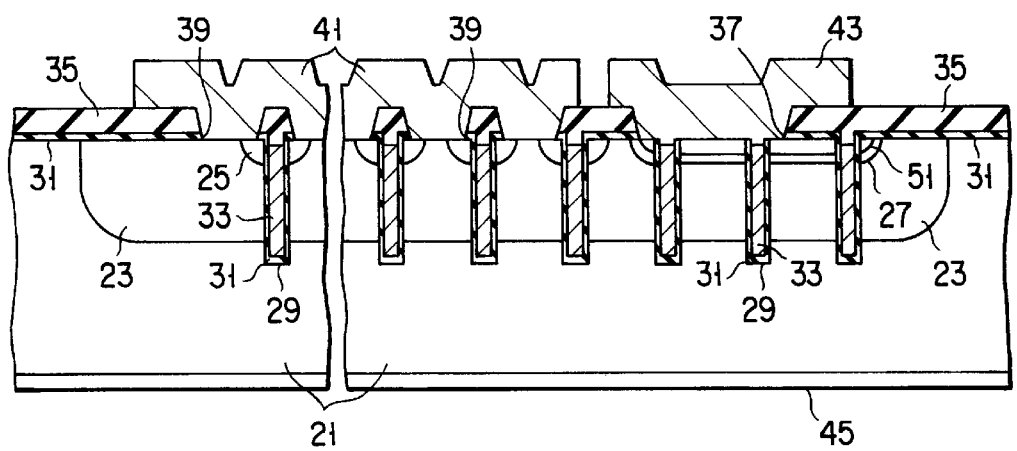
FIG. 9 is a schematic cross-sectional view illustrating the structure of a U-MOS according to a second embodiment of the present invention.

FIG. 9 is a schematic cross-sectional view showing the structure of a U-MOS according to a second embodiment of the present invention. This view corresponds to the cross section of the U-MOS of the first embodiment shown in FIG. 7A.

The U-MOS of the second embodiment differs from that of the first embodiment in the following two points:

(1) After an n-type source region 25 and an n-type gate leading region 27 are formed in a p-type base region 23, a p-type gate contact region 51 of a conductivity type opposite to that of the region 27 (or equal to that of the base region 23) is formed in the region 27.

(2) A gate electrode contact hole 37 is formed in correspondence with the p-type gate contact region 51, and a gate electrode 43 is formed so as to contact both the gate contact region 51 and polysilicon 33 in trenches 29 formed in the region 51.

Figure 10:
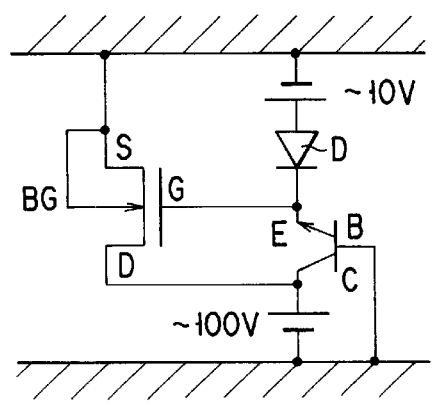
FIG. 10 is an equivalent circuit diagram of the U-MOS illustrated in FIG. 9.

FIG. 10 illustrates an equivalent circuit of the above-described U-MOS according to the second embodiment.

The U-MOS shown in FIG. 9 includes a diode D of a pn-junction between the p-type gate contact region 51 and n-type gate leading region 27 as well as an n-channel MOS transistor and a parasitic npn transistor.

When the U-MOS so constituted is employed, a reverse bias is applied to a pn junction between the p-type base region 23 and n-type gate leading region 27, and a forward bias is applied to the diode D described above. Consequently, since a Zener diode is preset in the U-MOS, a through current can be prevented from flowing from the gate electrode to the base region even though noise of negative bias is caused.

The first and second embodiments are directed to a U-MOS. However, the present invention is not limited to this. For example, it can be applied to a U-IGBT.

It is needless to say that various changes and modifications can be made without departing from the scope of the subject matter of the present invention.

According to the present invention described above in detail, when a U-MOS or a U-IGBT is manufactured, a step of forming a pad for contact for leading a gate electrode, which involves an exposure step, can be deleted to reduce the number of manufacturing steps, and so can be a step of extracting polysilicon from a trench section and leading it to the pad, thereby preventing an electric field from concentrating upon a corner portion of the trench section and improving the reliability of a gate insulation film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a semiconductor substrate of a first conductivity type serving as a drain region of a MOS transistor;
    a base region of the MOS transistor formed in a surface area of the semiconductor substrate and consituted of a semiconductor layer of a second conductivity type;
    a source region of the first conductivity type and a gate leading region of the first conductivity type both formed in a surface area of the base region seperately from each other;
    trench sections formed in the source region and the gate leading region to such a depth as to penetrate the base region;
    a gate insulation film formed on inner walls of the trench sections and a surface of the semiconductor substrate;
    polysilicon buried into the trench sections and thermally treated;
    an interlayer insulation film deposited on the semiconductor substrate and located at least in the gate leading region; and
    a gate electrode which is connected to both the gate leading region and the polysilicon of the trench sections formed in the gate leading region through a gate electrode contact hole, said gate electrode contact hole being formed in the interlayer insulation film and the gate insulation film formed thereunder.

2. A semiconductor device according to claim 1, wherein the trench section has a grid pattern constituted of a plurality of trenches coupled to each other at both end portions and at least a halfway portion in a longitudinal direction.

3. A semiconductor device according to claim 1, further comprising a gate contact region of the first conductivity type formed in a surface area of the gate leading region, and wherein the gate electrode contacts both the gate contact region and the polysilicon in the trench section in the gate contact region through a gate electrode contact hole corresponding to the gate contact region.

4. A semiconductor device according to claim 1, further comprising:
    a source/base electrode contacting both the source region and the base region in a peripheral portion of the trench section through a source/base leading contact hole corresponding to the peripheral portion of the trench section in the source region and formed in the interlayer insulation film and the gate insulation film formed thereunder.

5. A semiconductor device according to claim 4, wherein the trench section has a grid pattern constituted of a plurality of trenches coupled to each other at both end portions and at least a halfway portion in a longitudinal direction.

6. A semiconductor device according to claim 4, further comprising a gate contact region of the first conductivity type formed in a surface area of the gate leading region, and wherein the gate electrode contacts both the gate contact region and the polysilicon in the trench section in the gate contact region through a gate electrode contact hole corresponding to the gate contact region.

7. A method of manufacturing a semiconductor device, comprising the steps of:
    forming a base region of a second conductivity type in a surface area of a semiconductor substrate of a first conductivity type;
    forming both a source region of the first conductivity type and a gate leading region of the first conductivity type in a surface area of the base region separately from each other;
    forming a trench section in the source region and the gate leading region to such a depth as to penetrate the base region;
    burying polysilicon into the trench section with a gate insulation film interposed therebetween, thermally treating the polysilicon, and then etching back an entire surface of the polysilicon in the trench section until a top surface of the polysilicon becomes lower than a surface of the semiconductor substrate;
    depositing an interlayer insulation film on an entire surface of the semiconductor substrate with the gate insulation film interposed therebetween and then forming a gate electrode contact hole, which corresponds to the gate leading region, in the interlayer insulation film and the gate insulation film formed thereunder; and
    forming a gate electrode contacting both the gate leading region and the polysilicon in the trench section in the gate leading region through the gate electrode contact hole.

8. A method according to claim 7, wherein the trench section has a grid pattern constituted of a plurality of trenches coupled to each other at both end portions and at least a halfway portion in a longitudinal direction.

9. A method according to claim 7, further comprising a step of forming a gate contact region of the second conductivity type formed in the gate leading region after both the source region and the gate leading region are formed in the surface area of the base region, and wherein a gate electrode contact hole corresponding to the gate contact region is formed, and a gate electrode is formed so as to contact both the gate contact region and the polysilicon in the trench section in the gate contact region through the gate electrode contact hole.

10. A method of manufacturing a semiconductor device, comprising the steps of:
    forming a base region of a second conductivity type in a surface area of a semiconductor substrate of a first conductivity type;
    forming both a source region of the first conductivity type and a gate leading region of the first conductivity type in a surface area of the base region separately from each other;
    forming a trench section in the source region and the gate leading region to such a depth as to penetrate the base region;
    forming a gate insulation film on an inner wall of the trench section and a surface of the semiconductor substrate;
    burying polysilicon into the trench section with the gate insulation film interposed therebetween, thermally treating the polysilicon, and then etching back an entire surface of the polysilicon in the trench section until a top surface of the polysilicon becomes lower than a surface of the semiconductor substrate;
    depositing an interlayer insulation film on an entire surface of the semiconductor substrate, and then forming a gate electrode contact hole, which corresponds to the gate leading region, in the interlayer insulation film and the gate insulation film formed thereunder and forming a source/base leading contact hole in a peripheral portion of the trench section in the source region; and forming a gate electrode contacting both the gate leading region and the polysilicon in the trench section in the gate leading region through the gate electrode contact hole, and forming a source/base electrode contacting both the source region and the base region in the peripheral portion of the trench section through the source/base leading contact hole.

11. A method according to claim 10, wherein the trench section has a grid pattern constituted of a plurality of trenches coupled to each other at both end portions and at least a halfway portion in a longitudinal direction.

12. A method according to claim 10, further comprising a step of forming a gate contact region of the second conductivity type formed in the gate leading region after both the source region and the gate leading region are formed in the surface area of the base region, and wherein a gate electrode contact hole corresponding to the gate contact region is formed, and a gate electrode is formed so as to contact both the gate contact region and the polysilicon in the trench section in the gate contact region through the gate electrode contact hole.

* * * * *

UNITED STATES PATENT AND TRADEMARK OFFICE
CERTIFICATE OF CORRECTION

PATENT NO.     : 6,265,744 B1
DATED          : July 24, 2001
INVENTOR(S)    : Hideki Okumura It is certified that error appears in the above-identified patent and that said Letters Patent is hereby corrected as shown below:

<u>Title page,</u>
Item [57], ABSTRACT,
Line 3, "source area" should read -- surface area --.

<u>Column 7,</u>
Line 18, "seperately" should read -- separately --.

Signed and Sealed this

Third Day of September, 2002

Attest:

Attesting Officer

JAMES E. ROGAN
Director of the United States Patent and Trademark Office